(12) United States Patent
Olen et al.

(10) Patent No.: US 8,466,754 B1
(45) Date of Patent: Jun. 18, 2013

(54) LOW PHASE NOISE MEMS-BASED OSCILLATOR WITH BIFURCATION AND PARAMETRIC NOISE SQUEEZING

(75) Inventors: Vadim Olen, Cedar Rapids, IA (US); Jonathan A. Lovseth, Marion, IA (US); Robert C. Potter, Marion, IA (US); Robert A. Newgard, Central City, IA (US); Roy H. Olsson, III, Albuquerque, NM (US); Kenneth E. Wojciechowski, Albuquerque, NM (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/152,685

(22) Filed: Jun. 3, 2011

(51) Int. Cl.
*H03B 5/30* (2006.01)

(52) U.S. Cl.
USPC ........ 331/116 M; 331/154; 331/109; 331/183

(58) Field of Classification Search
USPC ......... 331/109, 182, 183, 154, 116 R, 116 M, 331/158, 116 FE
See application file for complete search history.

(56) References Cited

U.S. PATENT DOCUMENTS

| | | | |
|---|---|---|---|
| 6,741,137 B1* | 5/2004 | Sibrai et al. | 331/109 |
| 2007/0257740 A1* | 11/2007 | Boser et al. | 331/154 |
| 2008/0178672 A1* | 7/2008 | Kanai et al. | 73/504.12 |

* cited by examiner

*Primary Examiner* — Ryan Johnson
(74) *Attorney, Agent, or Firm* — Donna P. Suchy; Daniel M. Barbieri

(57) ABSTRACT

The present invention is a method for reducing phase noise in oscillator signals. For example, the oscillator may be a low phase noise MEMS-based oscillator and may include a resonator (ex.—a MEMS resonator). Further, the resonator of the oscillator may be operated near a bifurcation point. Still further, the MEMS resonator may be parametrically pumped in such a way so as to redistribute the quadrature signal noise (ex.—phase noise) to in-phase noise (ex.—amplitude noise).

16 Claims, 3 Drawing Sheets

LOW PHASE NOISE MEMS-BASED OSCILLATOR WITH BIFURCATION AND PARAMETRIC NOISE SQUEEZING

FIELD OF THE INVENTION

The present invention relates to the field of oscillators and particularly to a low phase noise microelectromechanical systems (MEMS)-based oscillator with bifurcation and parametric noise squeezing.

BACKGROUND OF THE INVENTION

Currently available oscillators may not provide a desired level of performance and may provide signals with an undesirable level of phase noise.

Thus, it would be desirable to provide an oscillator which obviates problems associated with current solutions.

SUMMARY OF THE INVENTION

Accordingly, an embodiment of the present invention is directed to an oscillator, including: an amplifier; a resonator, the resonator being coupled with the amplifier; an amplitude control unit, the amplitude control unit being coupled with the amplifier and being configured for receiving a first oscillating signal from the amplifier, the first oscillating signal being generated via feedback interaction between the amplifier and the resonator and having a first amount of phase noise, the amplitude control unit being further configured for modifying an amplitude of the first oscillating signal and for transmitting the amplitude-modified first oscillating signal to the resonator; a pump drive coupled with the amplitude control unit and the resonator, the pump drive being configured for receiving from the amplitude control unit an indication of the first phase of the amplitude-modified first oscillating signal, the pump drive being further configured for generating a pump signal based upon the indicating signal and supplying the pump signal to the resonator, wherein the pump signal is phase-shifted (ex.—at least substantially 90 degrees) from the first oscillating signal; and an output buffer coupled with the amplitude control unit. The resonator is further configured for generating a second oscillating signal, the second oscillating signal being based upon at least one of the amplitude-modified first oscillating signal and the pump signal, the second oscillating signal being provided to the amplitude control unit via the amplifier, the second oscillating signal having a second amount of phase noise, said second amount of phase noise being less than the first amount of phase noise. The amplitude control unit modifies an amplitude of the second oscillating signal. The amplitude control unit transmits the amplitude-modified second amplitude control signal to the output buffer. The output buffer generates an output signal based upon the amplitude-modified second oscillating signal, said output signal having a lesser amount of phase noise than the first amount of phase noise. The amplifier is configured for increasing power levels of the oscillating signals. The oscillator may further include a heater control module, the heater module being connected to the resonator, said heater control module being configured for providing temperature stabilization for the oscillator. The resonator may be operated near the bifurcation point.

A further embodiment of the present invention is directed to a method for reducing phase noise in oscillator signals, the method including: generating a first oscillating signal via feedback interaction between a resonator and an amplifier and transmitting the first oscillating signal from the resonator to an amplitude control unit; receiving the first oscillating signal at the amplitude control unit, the received first oscillating signal having a first amount of phase noise; modifying an amplitude of the first oscillating signal via the amplitude control unit; transmitting the amplitude-modified first oscillating signal from the amplitude control unit to the resonator and receiving the amplitude-modified first oscillating signal at the resonator; providing an indicating signal from the amplitude control unit to a pump drive and receiving the indicating signal at the pump drive, the indicating signal being generated based upon at least one of: the amplitude-modified first oscillating signal and the first oscillating signal, the indicating signal providing information about at least one of: an operating amplitude of the resonator, phase of the resonator and phase noise of the resonator; generating a pump signal via the pump drive, said pump signal being based upon the indicating signal; providing the pump signal from the pump drive to the resonator and receiving the pump signal at the resonator, the pump signal being phase shifted at least substantially ninety degrees from the first oscillating signal; generating a second oscillating signal, said second oscillating signal being generated based upon at least one of: the amplitude-modified first oscillating signal and the pump signal; transmitting the second oscillating signal from the resonator to the amplitude control unit and receiving the second oscillating signal at the amplitude control unit, the received second oscillating signal having a second amount of phase noise, said second amount of phase noise being less than the first amount of phase noise; modifying an amplitude of the second oscillating signal via the amplitude control unit; transmitting the amplitude-modified second oscillating signal from the amplitude control unit to an output buffer and receiving the amplitude-modified second amplitude control signal at the output buffer; generating an output signal via the output buffer, said output signal being based upon the received amplitude-modified second oscillating signal, said output signal having a lesser amount of phase noise than the first amount of phase noise; and providing the output signal from the output buffer to a load.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
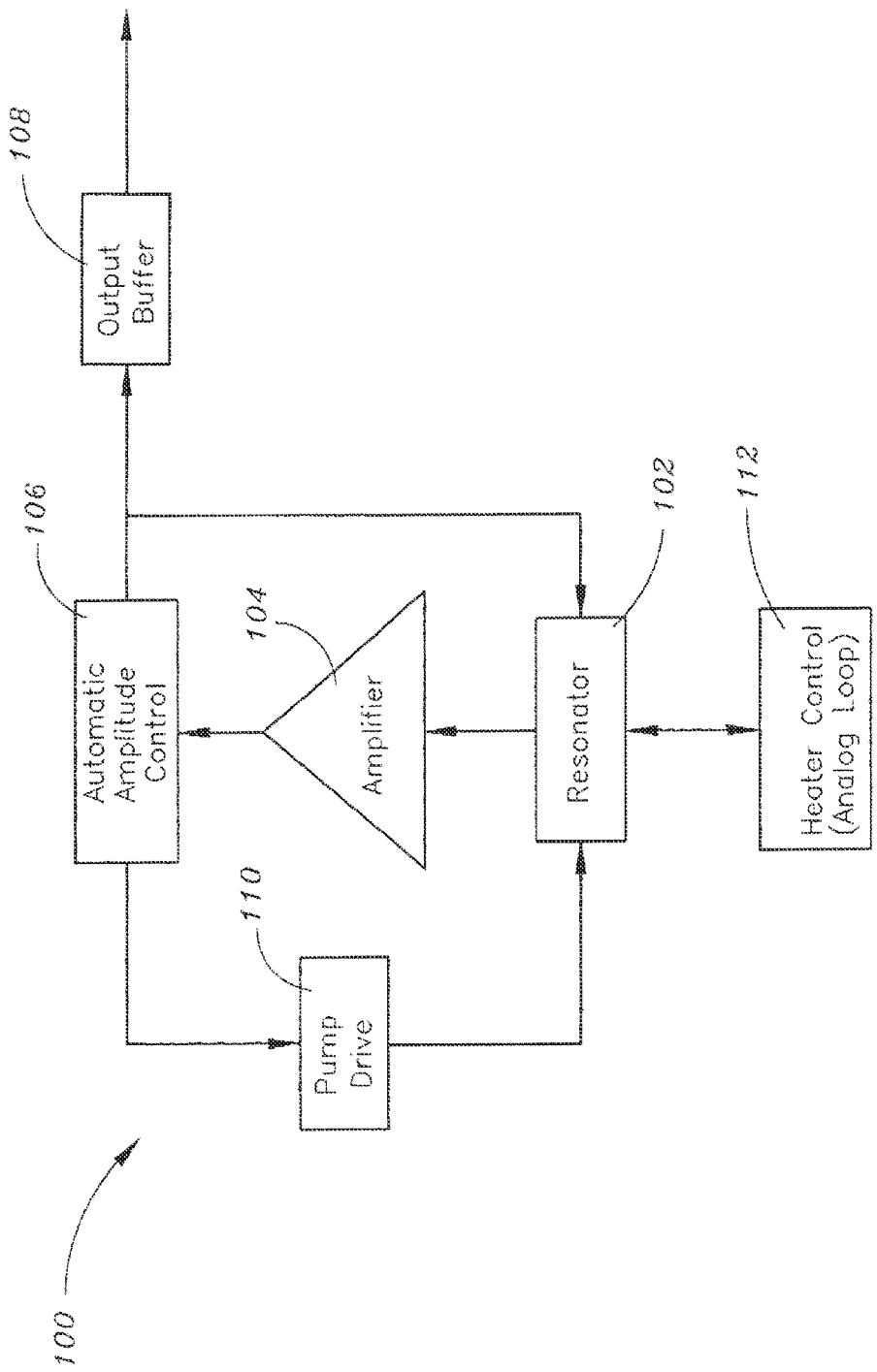
FIG. 1 is a block diagram of an oscillator for reducing phase noise in oscillator signals in accordance with an exemplary embodiment of the present invention.

Referring to FIG. 1, an oscillator 100 in accordance with an exemplary embodiment of the present disclosure is shown.

The oscillator 100 (exs.—an electronic oscillator, a microelectromechanical systems (MEMS)-based oscillator, a MEMS oscillator) may include a resonator 102. For instance, the resonator 102 may be a mechanical device and/or a microelectromechanical systems (MEMS)-based resonator 102 (ex.—a MEMS resonator 102). In exemplary embodiments, the electronic oscillator 100 may be an electronic circuit which is configured for producing output signal(s) (exs.—oscillator output signal(s), repetitive electronic signal(s), such as sine wave(s) or a square wave(s)). In further embodiments, the oscillator 100 may be configured for implementation in electronic device(s). In still further embodiments, the resonator 102 of the oscillator may be configured for naturally oscillating at some frequencies (ex.—its resonant frequencies) with greater amplitude than at other frequencies.

In exemplary embodiments, the oscillator 100 may further include an amplifier 104. The amplifier 104 may be connected to the resonator 102. For example, input(s) of the amplifier 104 may be connected to output(s) of the resonator 102. In further embodiments, the amplifier 104 may be a device which is configured for changing (exs.—increasing an amplitude of, amplifying) input signal(s) (exs.—voltage(s), current(s), oscillator output signals) received by said amplifier 104. The amplifier 104 may be further configured for providing (ex.—outputting) said amplified signal(s) as amplifier output(s) (ex.—amplifier output signal(s)).

In further embodiments, the oscillator 100 may further include an amplitude control unit 106. The amplitude control unit 106 is connected to the amplifier 104. For example, an output of the amplifier 104 may be connected to input(s) of the amplitude control unit 106. In exemplary embodiments, the amplitude control unit 106 may be configured for providing automatic amplitude control for the oscillator 100, based at least in part upon received amplifier output(s) (ex.—received amplifier output signal(s)). In further embodiments, the amplitude control unit 106 may be connected to the resonator 102. For instance, output(s) of the amplitude control unit 106 are connected to input(s) of the resonator 102.

In exemplary embodiments, the oscillator 100 may further include an output buffer 108. The output buffer 108 may be connected to the amplitude control unit 106. For example, output(s) of the amplifier control unit 106 may be connected to input(s) of the output buffer 108. The output buffer 108 may further be configured for being connected to a load, and may be configured for isolating the resonator 102 from the load. The output buffer 108 may be configured for providing output signal(s) (ex.—output buffer output signal(s)), said output signal(s) being based upon signal(s) (ex.—amplitude control unit output signal(s)) received by the output buffer 108 from the amplitude control unit 106.

In further embodiments, the oscillator 100 may further include a pump drive module 110 (ex.—pump drive). The pump drive module 110 may be connected to the amplitude control unit 106. For example, output(s) of the amplifier control unit 106 may be connected to input(s) of the pump drive module 110. In exemplary embodiments, the pump drive module 110 may be connected to the resonator 102. For instance, output(s) of the pump drive module 110 may be connected to input(s) of the resonator 102. In further embodiments, the pump drive module 110 may be configured for providing output signal(s) (ex.—pump signal(s)) to the resonator 102, said pump signal(s) being based upon output signal(s) received from the amplitude control unit 106.

In exemplary embodiments, the oscillator 100 may further include a heater control module (ex.—an analog loop 112). The heater control module 112 may be connected to (ex.—communicatively coupled with) the resonator 102. The heater control module 112 may be configured for providing temperature stabilization for the oscillator 100.

In further embodiments, the resonator 102 may be configured for being operated near a bifurcation point. For instance, the resonator 102 may be configured for bifurcating (ex.—operating at one of two different amplitudes) when being driven with a high amplitude signal. Which of two different amplitudes the resonator 102 is running at may be determined by whether the frequency has been increasing or decreasing to arrive at that point (ex.—hysteresis). Further, the resonator 102 may be parametrically pumped in such a way so as to redistribute quadrature signal noise (ex.—phase noise) to in-phase noise (ex.—amplitude noise). By operating the resonator near a bifurcation point, and by providing parametric noise squeezing via said parametric pumping of the resonator 102, phase noise of the resonator 102 may be reduced by as much as 8 decibels (dB).

Figure 2A:
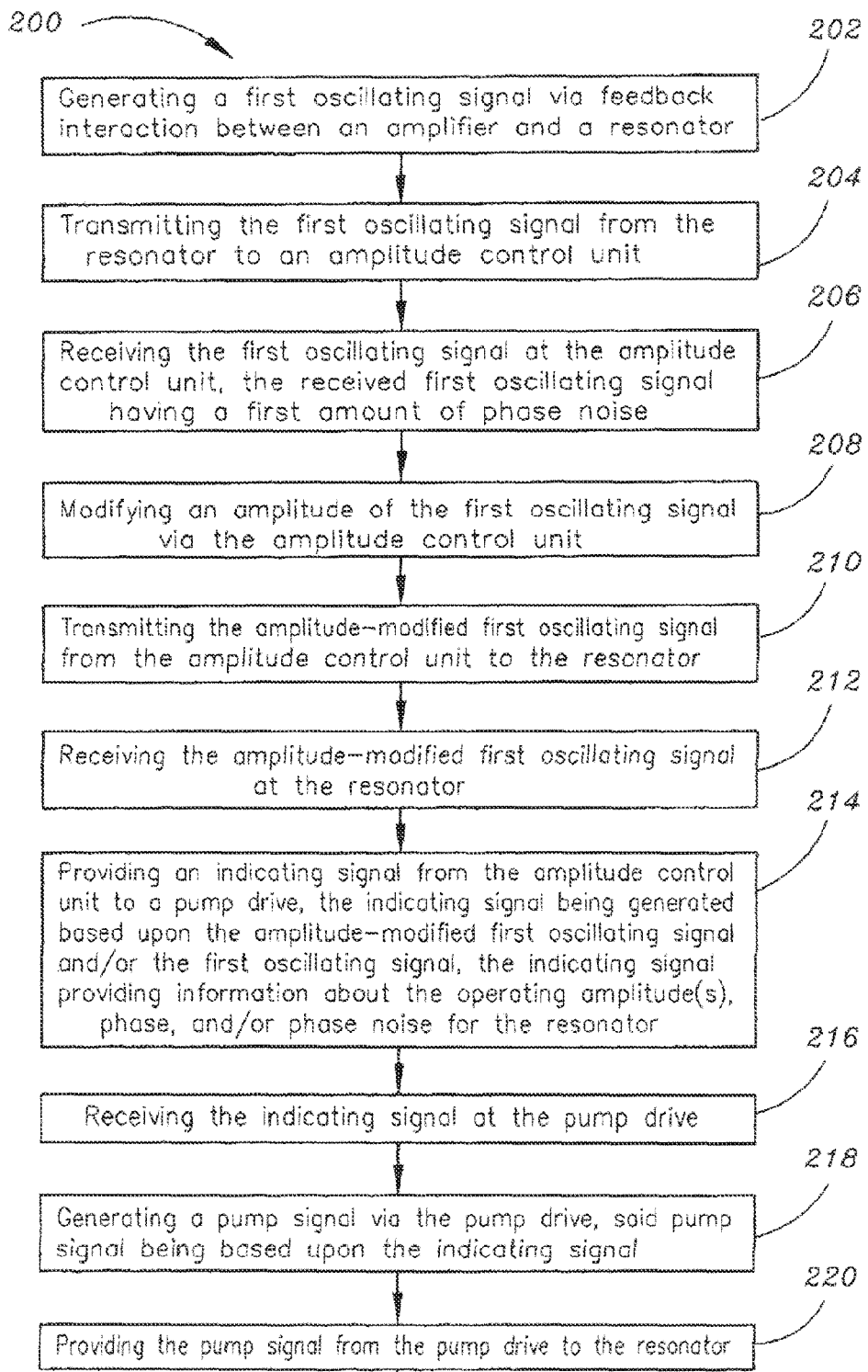
FIGS. 2A-2B depict a flow chart illustrating a method for reducing phase noise in oscillator signals in accordance with an exemplary embodiment of the present invention.
Figure 2B:
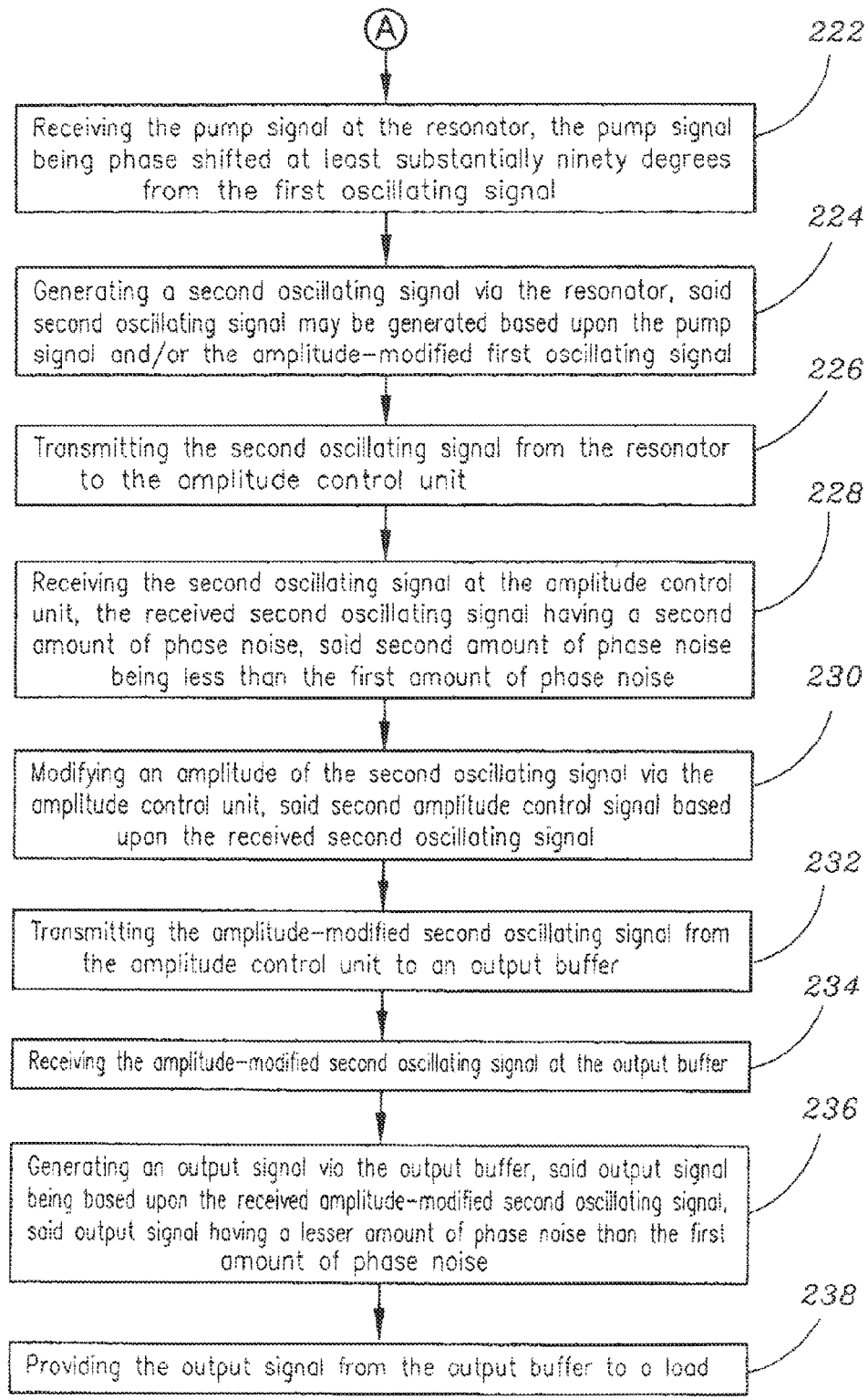

Referring to FIGS. 2A-2B, a flowchart illustrating a method for reducing phase noise in oscillator signals, such as by implementing an embodiment of the oscillator 100 described above, in accordance with an exemplary embodiment of the present invention is shown. The method 200 may include the step of generating a first oscillating signal via feedback interaction between an amplifier and a resonator 202. The method 200 may further include the step of transmitting the first oscillating signal from the resonator to an amplitude control unit 204. The method 200 may further include the step of receiving the first oscillating signal at the amplitude control unit 206. For example, the received first oscillating signal may have a first amount of phase noise. The method 200 may further include the step of modifying an amplitude of the first oscillating signal via the amplitude control unit 208.

The method 200 may further include the step of transmitting the amplitude-modified first oscillating signal from the amplitude control unit to the resonator 210. The method 200 may further include the step of receiving the amplitude-modified first oscillating signal at the resonator 212. The method 200 may further include the step of providing an indicating signal from the amplitude control unit to a pump drive 214. For example, the indicating signal may be generated based upon the amplitude-modified first oscillating signal and/or the first oscillating signal. Further, the indicating signal may provide information about the operating amplitude(s), phase, and/or phase noise of the resonator. The method 200 may further include the step of receiving the indicating signal at the pump drive 216.

The method 200 may further include the step of generating a pump signal via the pump drive, said pump signal being based upon the indicating signal 218. For instance, the pump signal may be provided to the resonator when the resonator is operating at the resonator's resonance peaks (ex.—the resonator's maximum operating amplitude and/or the resonator's minimum operating amplitude). The pump signal (ex.—parametric pump signal) may activate at the resonator's (ex.—the MEMS oscillator's) resonance peaks to boost power in the resonator at those times. Further, the pump signal may be derived (exs.—time-shifted, inverted, etc.) from the oscillator output signal (ex.—the first oscillating signal). The method 200 may further include the step of providing the pump signal from the pump drive to the resonator 220. The method 200 may further include the step of receiving the pump signal at the resonator 222. For instance, the pump signal may be phase shifted at least substantially ninety degrees (ex.—ninety degrees) from the first oscillating signal. In exemplary embodiments, the pump signal may serve to squeeze noise from quadrature-phase (ex.—phase noise) to in-phase (ex.— amplitude noise). In further embodiments, the pump signal may be applied through an external capacitive plate, or may be added to main drive signal. The method 200 may further include the step of generating a second oscillating signal via the resonator 224. For example, said second oscillating signal may be generated based upon the pump signal and/or the amplitude-modified first oscillating signal.

The method 200 may further include the step of transmitting the second oscillating signal from the resonator to the amplitude control unit 226. The method 200 may further include the step of receiving the second oscillating signal at the amplitude control unit 228. For example, the received second oscillating signal may have a second amount of phase noise, said second amount of phase noise being less than the first amount of phase noise. The method 200 may further include the step of modifying an amplitude of the second oscillating signal via the amplitude control unit, said second amplitude control signal being based upon the received second oscillating signal 230. The method 200 may further include the step of transmitting the amplitude-modified second oscillating signal from the amplitude control unit to an output buffer 232. The method 200 may further include the step of receiving the amplitude-modified second oscillating signal at the output buffer 234. The method 200 may further include the step of generating an output signal via the output buffer, said output signal being based upon the received amplitude-modified second oscillating signal, said output signal having a lesser amount of phase noise than the first amount of phase noise 236. The method 200 may further include the step of providing the output signal from the output buffer to a load 238. For example, the oscillator 100 may be implemented as part of (ex.—within) an electronic device and the output signal may be provided from the output buffer to a load of that electronic device.

Implementation of the oscillator 100 as described above may enable production of reduced phase noise, one Gigahertz (GHz) frequency standards and synthesizers. Reduced phase noise oscillators may translate directly into improved performance, such as in the areas of satellite communication and electronic warfare. The energy per bit vs. noise improvement provided by the system(s) and/or method(s) of the present invention may provide better system link margin for increased data channel capacity, greater range, and/or more efficient use of system power.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An oscillator, comprising:
an amplifier;
a resonator, the resonator being coupled with the amplifier;
an amplitude control unit, the amplitude control unit being coupled with the amplifier and being configured for receiving a first oscillating signal from the amplifier, the first oscillating signal being generated via feedback interaction between the amplifier and the resonator and having a first amount of phase noise, the amplitude control unit being further configured for modifying an amplitude of the first oscillating signal and for transmitting the amplitude-modified first oscillating signal to the resonator;
a pump drive coupled with the amplitude control unit and the resonator, the pump drive being configured for receiving from the amplitude control unit a signal indicating an amplitude of the amplitude-modified first oscillating signal, the pump drive being further configured for generating a pump signal based upon the indicating signal and supplying the pump signal to the resonator, wherein the pump signal is phase-shifted from the first oscillating signal and configured to activate at the resonance peaks of the resonator to boost power at the resonator when provided to the resonator, and
an output buffer coupled with the amplitude control unit.

2. An oscillator as claimed in claim 1, wherein the resonator is configured for generating a second oscillating signal, the second oscillating signal being based upon at least one of the amplitude-modified first oscillating signal and the pump signal, the second oscillating signal being provided to the amplitude control unit via the amplifier, the second oscillating signal having a second amount of phase noise, said second amount of phase noise being less than the first amount of phase noise.

3. An oscillator as claimed in claim 2, wherein the amplitude control unit modifies an amplitude of the second oscillating signal.

4. An oscillator as claimed in claim 3, wherein the amplitude control unit transmits the amplitude-modified second amplitude control signal to the output buffer.

5. An oscillator as claimed in claim 4, wherein the output buffer generates an output signal based upon the amplitude-modified second oscillating signal, said output signal having a lesser amount of phase noise than the first amount of phase noise.

6. An oscillator as claimed in claim 1, wherein the amplifier is configured for increasing a power level of the first oscillating signal.

7. An oscillator as claimed in claim 1, further comprising:
a heater control module, the heater module being connected to the resonator, said heater control module being configured for providing temperature stabilization for the oscillator.

8. An oscillator as claimed in claim 1, wherein the resonator is operated near a bifurcation point.

9. An oscillator as claimed in claim 1, wherein the pump signal is phase shifted at least substantially 90 degrees from the first oscillating signal.

10. A method for reducing phase noise in oscillator signals, the method comprising:
generating a first oscillating signal via feedback interaction between a resonator and an amplifier and transmitting the first oscillating signal from the amplifier to an amplitude control unit;

receiving the first oscillating signal at the amplitude control unit, the received first oscillating signal having a first amount of phase noise;

modifying an amplitude of the first oscillating signal via the amplitude control unit;

transmitting the amplitude-modified first oscillating signal from the amplitude control unit to the resonator and receiving the amplitude-modified first oscillating signal at the resonator; and providing an indicating signal from the amplitude control unit to a pump drive and receiving the indicating signal at the pump drive, the indicating signal being generated based upon at least one of: the amplitude-modified first oscillating signal and the first oscillating signal, the indicating signal providing information about an operating amplitude of the resonator;

generating a pump signal via the pump drive, said pump signal being based upon the indicating signal, the pump signal configured to activate at the resonance peaks of the resonator to boost power at the resonator when provided to the resonator.

11. A method as claimed in claim 10, further comprising:
providing the pump signal from the pump drive to the resonator and receiving the pump signal at the resonator, the pump signal being phase shifted at least substantially ninety degrees from the first oscillating signal.

12. A method as claimed in claim 11, further comprising:
generating a second oscillating signal, said second oscillating signal being generated based upon at least one of: the amplitude-modified first oscillating signal and the pump signal.

13. A method as claimed in claim 12, further comprising:
transmitting the second oscillating signal from the amplifier to the amplitude control unit and receiving the second oscillating signal at the amplitude control unit, the received second oscillating signal having a second amount of phase noise, said second amount of phase noise being less than the first amount of phase noise.

14. A method as claimed in claim 13, further comprising:
modifying an amplitude of the second oscillating signal via the amplitude control unit.

15. A method as claimed in claim 14, further comprising:
transmitting the amplitude-modified second oscillating signal from the amplitude control unit to an output buffer and receiving the amplitude-modified second amplitude control signal at the output buffer.

16. A method as claimed in claim 15, further comprising:
generating an output signal via the output buffer, said output signal being based upon the received amplitude-modified second oscillating signal, said output signal having a lesser amount of phase noise than the first amount of phase noise; and providing the output signal from the output buffer to a load.

* * * * *